(12) United States Patent
Chang et al.

(10) Patent No.: US 7,049,189 B2
(45) Date of Patent: May 23, 2006

(54) METHOD OF FABRICATING NON-VOLATILE MEMORY CELL ADAPTED FOR INTEGRATION OF DEVICES AND FOR MULTIPLE READ/WRITE OPERATIONS

(75) Inventors: Ko-Hsing Chang, Hsinchu (TW); Su-Yuan Chang, Hsinchu Hsien (TW)

(73) Assignee: Powerchip Semiconductor Corp., Hsinchu (TW)

( * ) Notice: Subject to any disclaimer, the term of this patent is extended or adjusted under 35 U.S.C. 154(b) by 107 days.

(21) Appl. No.: 10/708,904

(22) Filed: Mar. 31, 2004

(65) Prior Publication Data
US 2005/0176203 A1    Aug. 11, 2005

(51) Int. Cl.
*H01L 21/8238* (2006.01)

(52) U.S. Cl. .................. 438/211; 438/221; 438/276; 438/287

(58) Field of Classification Search .......... 438/211, 438/212, 216, 217, 221, 276, 289, 287; 257/324, 257/327, 329, 368, 390, 391, E21.21, E21.209, 257/E29.165, E29.308
See application file for complete search history.

(56) References Cited

U.S. PATENT DOCUMENTS

| | | | |
|---|---|---|---|
| 6,538,292 B1 | 3/2003 | Chang et al. | 257/391 |
| 6,639,271 B1 | 10/2003 | Zheng et al. | 257/324 |
| 6,835,621 B1 * | 12/2004 | Yoo et al. | 438/261 |

OTHER PUBLICATIONS

Wolf, Stanley; Process Integration for the VLSI Era vol. 2: Process Integration; p. 354; Lattice Press, 1990; Sunset Beach, CA.*

* cited by examiner

*Primary Examiner*—George Fourson
*Assistant Examiner*—Fernando L. Toledo
(74) *Attorney, Agent, or Firm*—Jiang Chyun IP Office

(57) ABSTRACT

A method of manufacturing a non-volatile memory cell includes forming a bottom dielectric layer and a charge trapping layer on a substrate sequentially. The electron trapping layer is patterned to form a trench exposing a portion of the bottom dielectric layer. A top dielectric layer is formed over the substrate and covers the electron trapping layer and the exposed bottom dielectric layer. A conductive layer is then formed on the top dielectric layer. The conductive layer, the top dielectric layer, the electron trapping layer and the bottom dielectric layer are patterned to form a stacked structure, wherein a width of the stacked structure is larger than a width of the trench. A source/drain region is formed in the substrate adjacent to the edges of the stacked structure. Because the electron trapping layer of the memory cell is divided into two isolation structures according to the invention, it is adapted for the integration of devices and for long-time operation.

11 Claims, 6 Drawing Sheets

METHOD OF FABRICATING NON-VOLATILE MEMORY CELL ADAPTED FOR INTEGRATION OF DEVICES AND FOR MULTIPLE READ/WRITE OPERATIONS

BACKGROUND OF INVENTION

1. Field of the Invention

The present invention relates to a method of fabricating a memory cell, and more particularly to a method of fabricating a non-volatile memory cell.

2. Description of the Related Art

In a variety of non-volatile memories, electrically erasable programmable read-only memory (EEPROM) can perform multiple storing, read/write and erasing functions and the data stored therein will not be erased even if the power is shut down. Therefore, it has been a memory device widely used in personal computers and electronic apparatuses. The typical EEPROM uses polysilicon as a floating gate and a control gate. When the memory is programmed, electrons injected into the floating gate will uniformly spread out therein. However, when defects exist in the tunneling oxide beneath the polysilicon floating gate, leakage currents occur and affect the reliability of the device.

In order to resolve the leakage-current issue of EEPROM, a charge trapping layer is used to replace the polysilicon floating gate. The material of the charge trapping layer can be, for example, silicon nitride. Usually, there are two silicon oxide layers on and under the silicon nitride charge trapping layer for forming a stacked structure with an oxide-nitride-oxide (ONO) layer. The memory cell having the stacked structure is called a silicon-oxide-nitride-oxide-silicon (SONOS) memory cell.

FIG. 1 is a figure showing a prior art SONOS memory cell. Please referring to FIG. 1, a ONO layer 102, which is composed of a bottom silicon oxide layer 104, a silicon nitride layer 106 and a top silicon oxide layer 108, is formed on a substrate 100. In addition, a polysilicon gate 112 is formed on the ONO layer 102, serving as a word line. The source/drain regions 118 are formed in the substrate 100 adjacent to the edges of the ONO layer 102, serving as buried bit lines. Moreover, spacers 116 are formed on the sidewalls of the polysilicon gate 112. Lightly doped regions 114 electrically connect with source/drain regions 118 in the substrate 100 beneath the spacers 116.

The prior art SONOS memory cell can perform forward read and reverse read by storing electrons in the right side or left side of the charge trapping layer. The difference of threshold voltages between the programmed cells for forward read and reverse read depends on the quantity and area of the trapped electrons. However, by the increase of the programming times, the difference of threshold voltages for forward read and reverse read will gradually be reduced. The trapped electrons in one side of the charge trapping layer will move to the other side. It results in programming failures. The failures will be more serious when size of devices shrinks.

Therefore, U.S. Pat. No. 6,538,292 discloses a flash memory device with a twin bit cell. The difference between the U.S. patent and the structure in FIG. 1 is that the former uses a polysilicon germanium layer as the electron trapping layer. An ion implantation process is performed to form an isolation area in the polysilicon germanium layer for dividing the polysilicon germanium layer into two discontinuous conductive areas as a twin bit cell structure. Because the isolation area is formed by ion implantation, misalignment arises so that the conductive areas on the drain side and source side have different sizes. That will affect the performance of the memory cell.

U.S. Pat. No. 6,639,271 discloses another method for forming dual bit nitride memory cell. The isolation barrier between the charge trapping layers is formed by sequentially depositing a oxide layer, an isolation barrier dielectric layer, a top dielectric layer and a polysilicon layer on a substrate; patterning these layers; and etching a portion of isolation barrier dielectric layer for forming a undercut isolation barrier dielectric layer. Then, silicon nitride spacers are formed on the sidewalls of the stacked structure composed of the oxide layer, the undercut isolation barrier dielectric layer, the top dielectric layer and the polysilicon layer. The silicon nitride spacers fill in the undercut regions of the isolation barrier dielectric layer for forming electron trapped regions. However, the silicon nitride spacers formed by the prior art method may directly contact the substrate and the polysilicon layer. That will cause the operational problems of the memory device.

SUMMARY OF INVENTION

Therefore, the object of the present invention is to provide a method of fabricating a non-volatile memory cell adapted for the integration of devices and for multiple read/write operations.

The other object of the present invention is to provide a method of fabricating a non-volatile memory cell, which can prevent device failures resulting from the misalignment of the charge trapping layer in the memory cell.

According to the objects above and the other objects, the present invention discloses a method of fabricating a method of fabricating a non-volatile memory cell, comprising: forming a bottom dielectric layer on a substrate; forming a charge trapping layer on the bottom dielectric layer; patterning the charge trapping layer, for forming a trench exposing a portion of the bottom dielectric layer; forming a top dielectric layer over the substrate, covering the charge trapping layer and the exposed bottom dielectric layer; forming a conductive layer over the substrate, covering the top dielectric layer; patterning the conductive layer, the top dielectric layer, the charge trapping layer and the bottom dielectric layer, for forming a stacked structure, wherein a width of the stacked structure is larger than a width of the trench; and forming source/drain regions in the substrate adjacent to edges of the stacked structure.

The present invention discloses another method of fabricating a method of fabricating a non-volatile memory cell, comprising: forming a bottom dielectric layer, a charge trapping layer, a first top dielectric layer and a mask layer on a substrate sequentially; etching the mask layer for forming a first trench exposing a portion of the first top dielectric layer; forming a plurality of first spacers on sidewalls of the first trench; using the first spacers as an etching mask and etching the first top dielectric layer and the charge trapping layer for forming a second trench; removing the first spacers; forming a second top dielectric layer over the substrate, covering surfaces of the second trench and the first trench; forming a conductive layer in the first trench and the second trench; removing the conductive layer and the second top dielectric layer outside of the first trench and the second trench for exposing the mask layer; removing the exposed mask layer; using the conductive layer as a mask, removing the first top dielectric layer, the charge trapping layer and the bottom dielectric layer for forming a stacked structure; and forming source/drain regions in the substrate adjacent to edges of the stacked structure.

The present invention separates the charge trapping layer into two independent structures. Accordingly, the present invention is adapted for the integration of devices and for long-time operation.

Additionally, the present invention uses spacers as a mask for separating the charge trapping layer. Therefore, the misalignment of the charge trapping layer in the memory cell can be avoided, and the operation of the device can be improved.

In order to make the aforementioned and other objects, features and advantages of the present invention understandable, a preferred embodiment accompanied with figures is described in detail below.

DETAILED DESCRIPTION

FIGS. 2A–2E are cross-sectional views showing a first exemplary process flow of fabricating a non-volatile memory cell.

Figure 1:
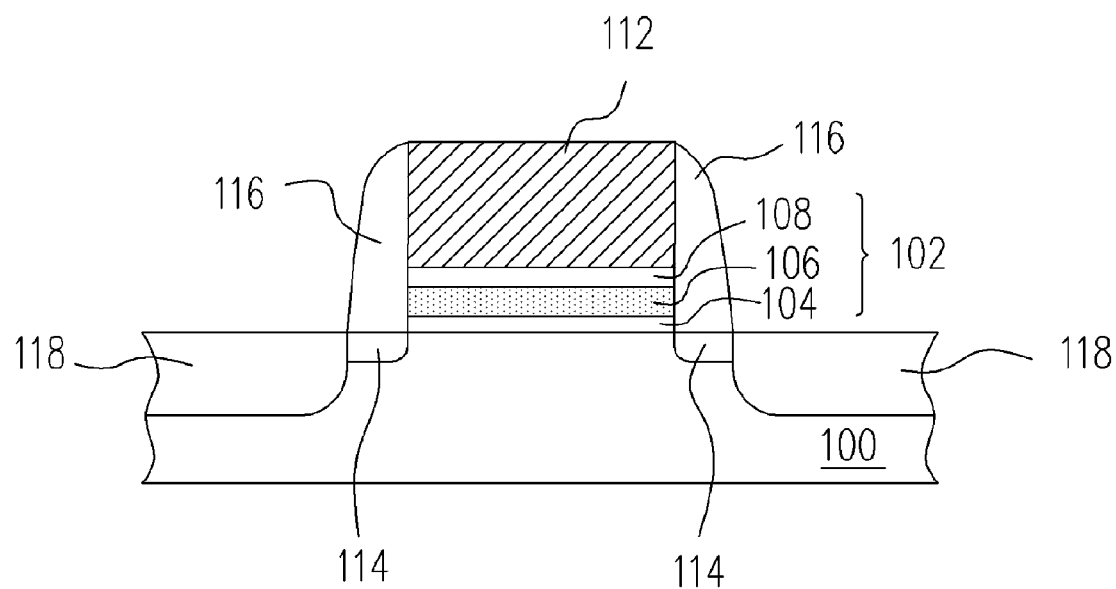
FIG. 1 is a figure showing a prior art SONOS memory cell.
Figure 2A:
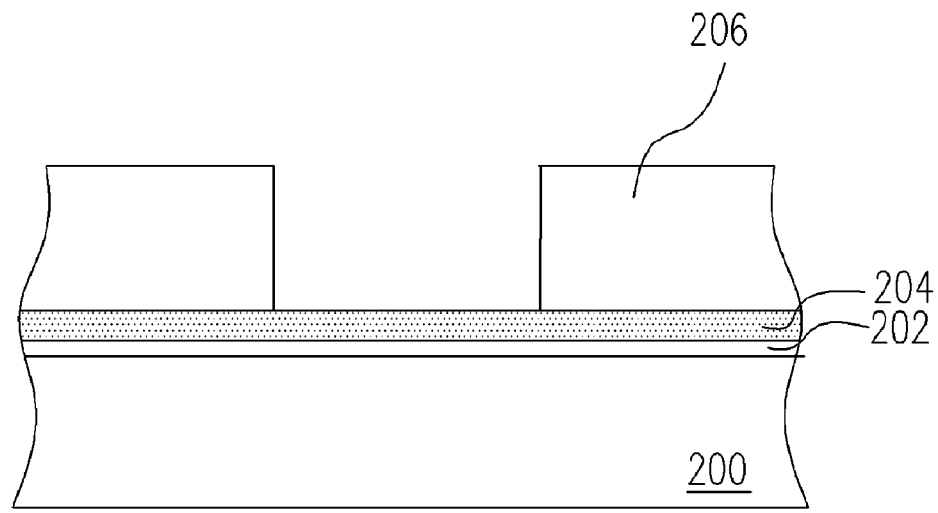
FIGS. 2A–2E are cross-sectional views showing a first exemplary process flow of fabricating a non-volatile memory cell.

Please referring to FIG. 2A, a bottom dielectric layer 202 is formed on a substrate 200. The step, for example, forms a silicon oxide layer on the surface of the substrate 200 by a thermal oxidation process. Then, a charge trapping layer 204 is formed on the bottom dielectric layer 204, wherein the material of the charge trapping layer 204 is, for example, selected from a group consisting of silicon nitride, tantalum oxide, $SrTiO_3$ and hafnium oxide. The step of forming the charge trapping layer 204 on the bottom dielectric layer 202 includes, for example, forming a silicon nitride layer on the bottom dielectric layer 202 by a chemical vapor deposition (CVD) process. Then, a patterned photoresist layer 206 is formed on the charge trapping layer 204.

Figure 2B:
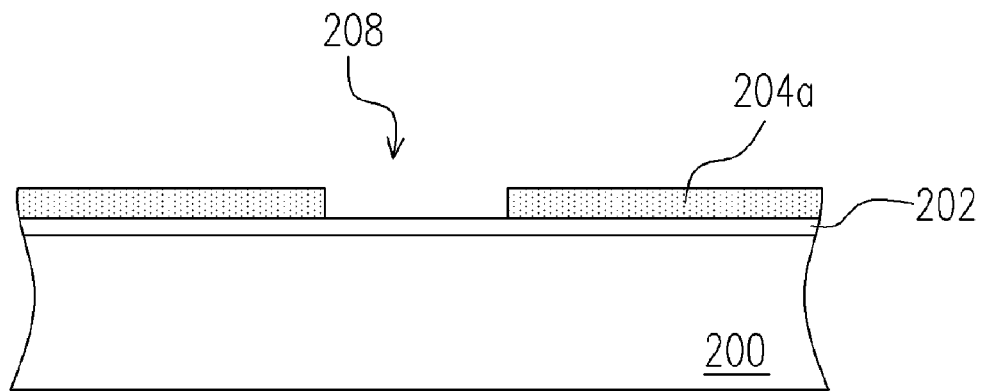

Please referring to FIG. 2B, the patterned photoresist layer 206 shown in FIG. 2A serves as an etching mask, and the charge trapping layer 204 is etched and patterned for forming a trench 208 exposing a portion of the bottom dielectric layer 202. Except to the method of this embodiment, the other methods known to one of ordinary skill in the art can be used to form the patterned charge trapping layer 204a. Then, the patterned photoresist layer 206 is removed.

Figure 2C:
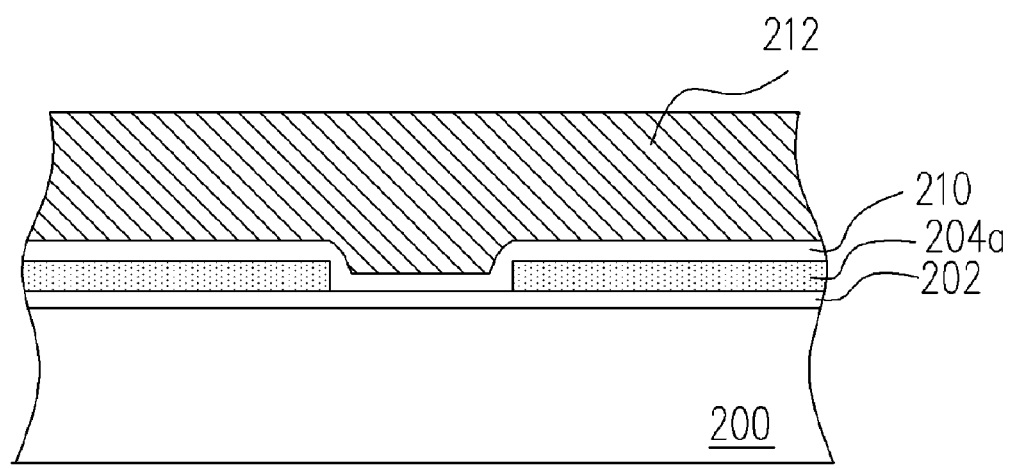

Please referring to FIG. 2C, a top dielectric layer 210 is formed over the substrate 200, covering the charge trapping layer 204a and the exposed bottom dielectric layer 202. A conductive layer 212 is formed over the substrate 200, covering the top dielectric layer 210, wherein the material of the conductive layer 212 is, for example, polysilicon.

Figure 2D:
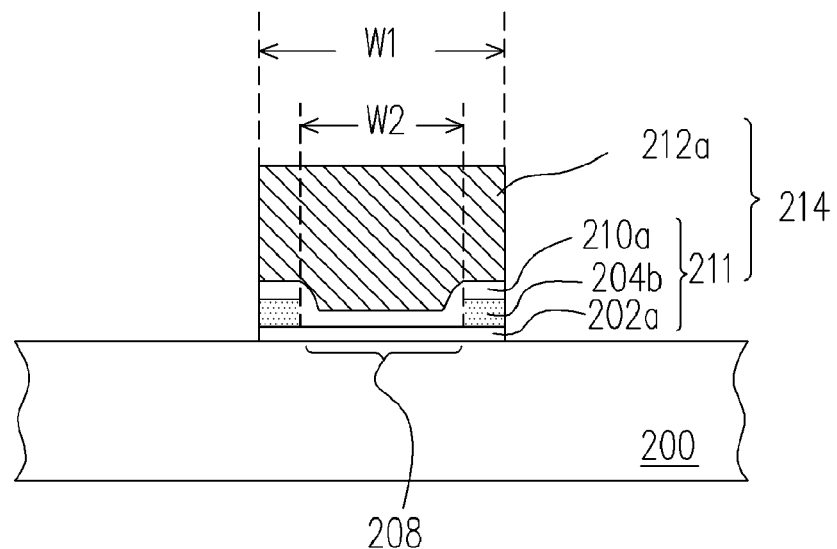

Please referring to FIG. 2D, the conductive layer 212, the top dielectric layer 210, the charge trapping layer 204a and the bottom dielectric layer 202 (shown in FIG. 2C) are patterned for forming a stacked structure 214, wherein the width W1 of the stacked structure 214 is larger than the width W2 of the trench 208. Moreover, the step of patterning the conductive layer 212, the top dielectric layer 210, the charge trapping layer 204a and the bottom dielectric layer 202 preferably includes aligning the trench 208 to the center of the stacked structure 214. The bottom dielectric layer 202a, the charge trapping layer 204b and the top dielectric layer 210a form a silicon oxide/silicon nitride/silicon oxide layer (ONO) 211. A non-volatile memory cell having the ONO layer 211 is called a silicon-oxide-nitride-oxide-silicon (SONOS) memory cell.

Figure 2E:
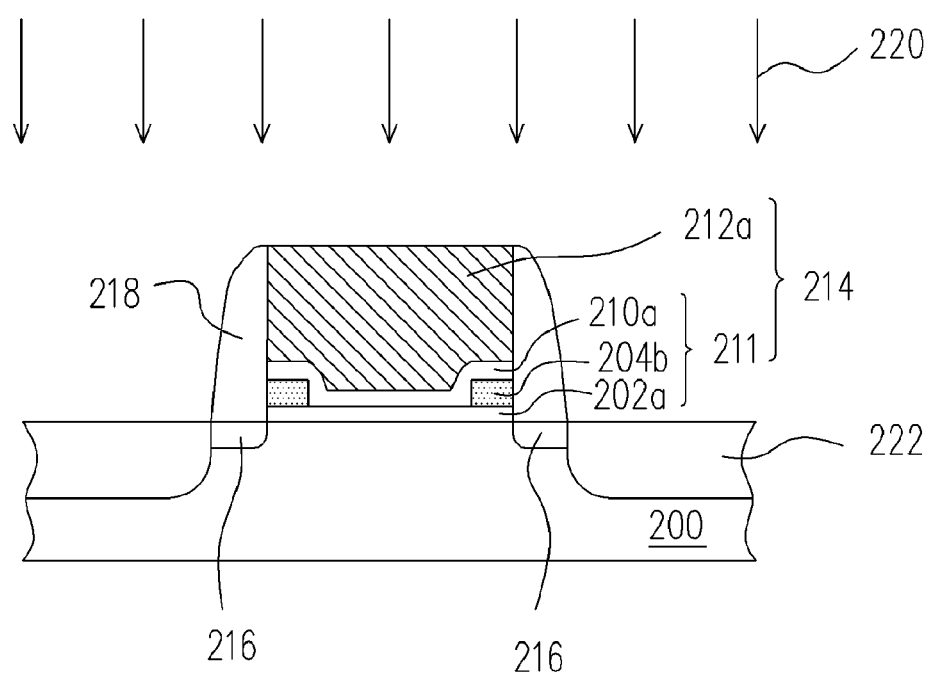

Please referring to FIG. 2E, a lightly doping process can be optionally performed for forming a plurality of lightly doped regions 216 in the exposed substrate 200. A plurality of spacers 218 can be optionally formed on the sidewalls of the stacked structure 214. The material of the spacers 218 can be, for example, silicon nitride or any other material adapted to be applied thereto. Then, a source/drain doping process 220 is performed for forming a plurality of source/drain regions 222 in the substrate 200 uncovered by the spacers 218 of the stacked structure 214.

In this embodiment, because the charge trapping layer of the memory cell is divided into two independent structures, the memory cell is adapted for the integration of devices and for long-time operation.

When size of memory cells shrinks, the issue of misalignment occurs. To resolve the issue, the present invention discloses another embodiment. FIGS. 3A–3F are cross-sectional views showing a second exemplary process flow of fabricating a non-volatile memory cell.

Figure 3A:
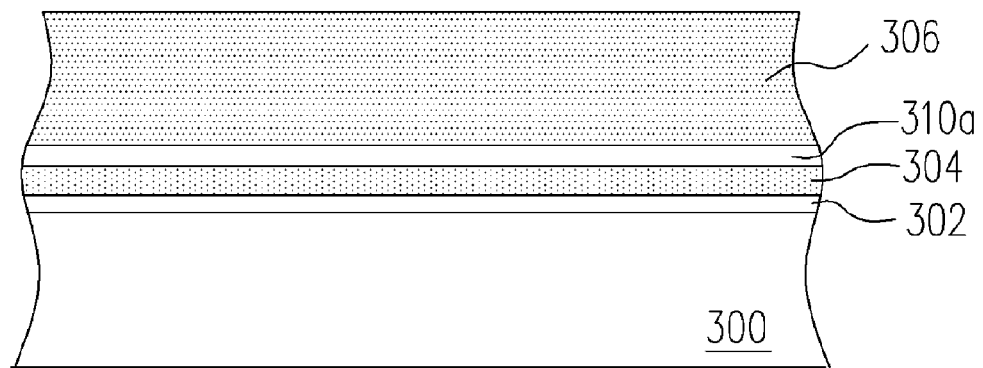
FIGS. 3A–3F are cross-sectional views showing a second exemplary process flow of fabricating a non-volatile memory cell.

Please referring to FIG. 3A, a bottom dielectric layer 302, a charge trapping layer 304, a first top dielectric layer 310a and a mask layer 306 are sequentially formed on a substrate 300, wherein the material of the charge trapping layer 304 is selected from a group consisting of silicon nitride, tantalum oxide, $SrTiO_3$ and hafnium oxide. The material of the first top dielectric layer 310a is, for example, silicon oxide. The material of the mask layer 306 is, for example, silicon nitride. The step of forming the bottom dielectric layer 302 on the substrate 300 includes, for example, forming a silicon oxide layer on the surface of the substrate 300 by a thermal oxidation process. The step of forming the charge trapping layer 304 on the bottom dielectric layer 302 includes, for example, forming a silicon nitride layer on the bottom dielectric layer 302 by a CVD process.

Figure 3B:
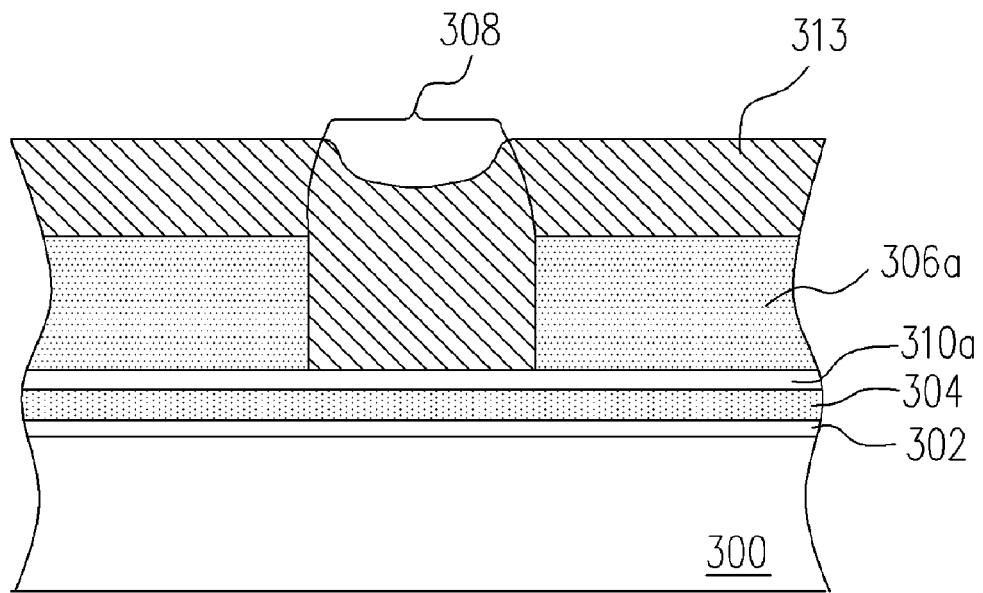

Please referring to FIG. 3B, the mask layer 306 is etched for forming a first trench 308 exposing a portion of the first top dielectric layer 310a. Then, first spacers (not shown) are formed on the sidewalls of the first trench 308 which are formed, for example, by forming a polysilicon layer 313 on the substrate 300.

Figure 3C:
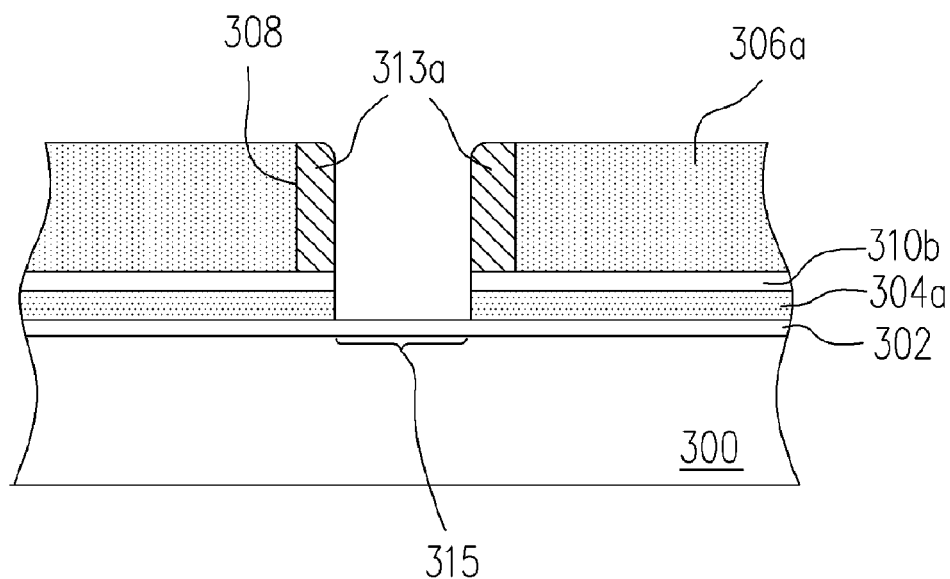

Please referring to FIG. 3C, the material layer 313 is etched back for forming the first spacers 313a on the sidewalls of the first trench 308. The first spacers 313a serve as an etching mask for etching the first top dielectric layer 310a and the charge trapping layer 304 (shown in FIG. 3B) for forming a second trench 315, which locates in the first top dielectric layer 310b and the charge trapping layer 304a. The second trench 315 self-aligns to the center of the first trench 308. Therefore, the issue of misalignment is resolved.

Figure 3D:
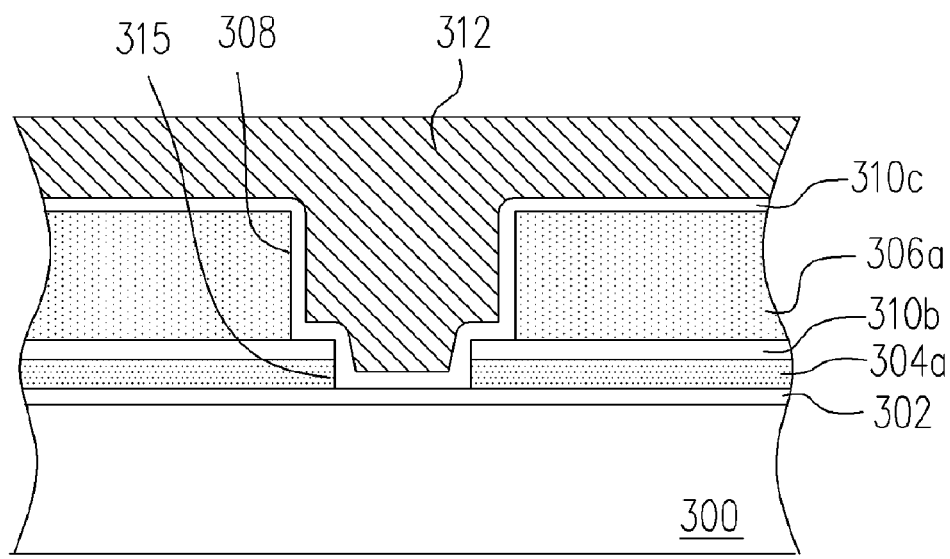

Please referring to FIG. 3D, the first spacers 313a are removed. A second top dielectric layer 310c is formed over the substrate 300, covering the surfaces of the first trench 308 and the second trench 315, wherein the material of the second top dielectric layer 310c is, for example, silicon oxide. Then, a conductive layer 312 is formed over the substrate 300, filling the first trench 308 and second trench 315.

Figure 3E:
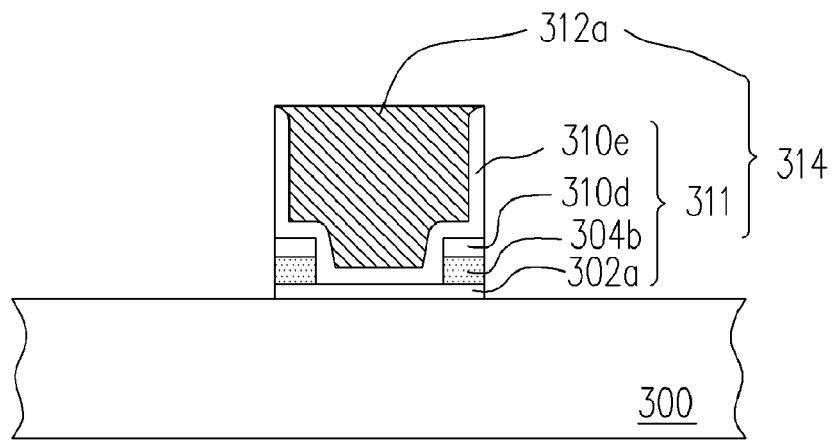

Please referring to FIG. 3E, the conductive layer 312 and the second top dielectric layer 310c outside of the second trench 315 and the first trench 308 are removed by a chemical mechanical polishing (CMP) process or an etch-back process for exposing the mask layer 306a. Then, the exposed mask layer 306a is removed. The conductive layer 312a serves as a mask for removing the exposed first top dielectric layer 310b, the exposed charge trapping layer 304a and exposed bottom dielectric layer 302 by a dry etching process as to form a stacked structure 314. The bottom dielectric layer 302a, the charge trapping layer 304b, the first top dielectric layer 310a and the second top dielectric layer 310e form a silicon oxide/silicon nitride/silicon oxide layer (ONO) 311. A non-volatile memory cell having the ONO layer 311 is called a silicon-oxide-nitride-oxide-silicon (SONOS) memory cell.

Figure 3F:
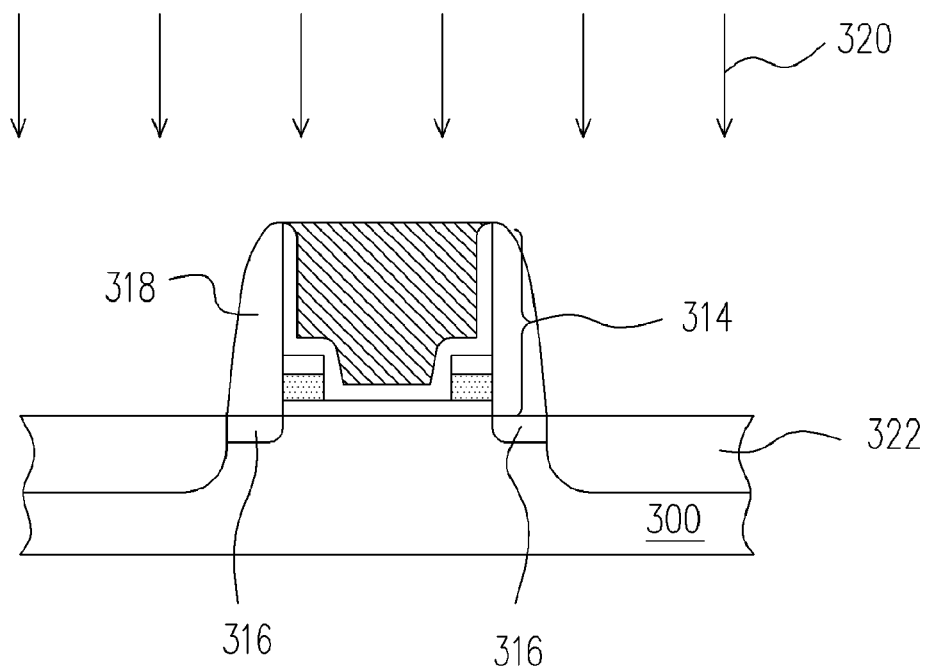

Please referring to FIG. 3F, a lightly doping process can be optionally performed for forming a plurality of lightly doped regions 316 in the exposed substrate 300. A plurality of spacers 318 can be optionally formed on the sidewalls of the stacked structure 314. The material of the spacers 218 can be, for example, silicon nitride or any other material adapted to be applied thereto. Then, a source/drain doping process 320 is performed for forming a plurality of source/drain regions 322 in the substrate 300 uncovered by the spacers 318 of the stacked structure 314.

Accordingly, one feature of the present invention is to divide the charge trapping layer of the memory cell into two independent structures, the memory cell is adapted for the integration of devices and for long-time operation.

Moreover, another feature of the present invention is to use the spacers as the mask separating the charge trapping layer. Therefore, the misalignment of the charge trapping layer in the memory cell can be avoided, and the operation of the device can be improved.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

The invention claimed is:

1. A method of fabricating a non-volatile memory cell, comprising:
    forming a bottom dielectric layer, a charge trapping layer, a first top dielectric layer and a mask layer on a substrate sequentially;
    etching the mask layer for forming a first wench exposing a portion of the first top dielectric layer;
    forming a plurality of first spacers on sidewalls of the first trench;
    using the first spacers as an etching mask and etching the first top dielectric layer and the charge trapping layer for forming a second trench;
    removing the first spacers;
    forming a second top dielectric layer over the substrate, covering surfaces of the second trench and the first trench;
    forming a conductive layer in the first trench and the second trench;
    removing the conductive layer and the second top dielectric layer outside of the first trench and the second trench for exposing the mask layer;
    removing the exposed mask layer;
    using the conductive layer as a mask, removing the first top dielectric layer, the charge trapping layer and the bottom dielectric layer for forming a stacked structure; and
    forming source/drain regions in the substrate adjacent to edges of the stacked structure.

2. The method of fabricating a non-volatile memory cell of claim 1, before forming the source/drain regions, further comprising:
    forming a plurality of lightly doped regions in the exposed substrate; and
    forming a plurality of second spacers on the sidewalls of the stacked structure.

3. The method of fabricating a non-volatile memory cell of claim 1, wherein the step of forming the bottom dielectric layer comprises forming a silicon oxide layer on a surface of the substrate by a thermal oxidation process.

4. The method of fabricating a non-volatile memory cell of claim 1, wherein the step of forming the charge trapping layer comprises forming a silicon nitride layer on the bottom dielectric layer by a chemical vapor deposition process.

5. The method of fabricating a non-volatile memory cell of claim 1, wherein the material of the mask layer comprises silicon nitride.

6. The method of fabricating a non-volatile memory cell of claim 1, wherein the material of the first spacers comprise polysilicon.

7. The method of fabricating a non-volatile memory cell of claim 1, wherein the material of conductive layer comprises polysilicon.

8. The method of fabricating a non-volatile memory cell of claim 1, wherein the material of the charge trapping layer is selected from a group consisting of silicon nitride, tantalum oxide, $SrTiO_3$ and hafnium oxide.

9. The method of fabricating a non-volatile memory cell of claim 1, wherein the material of the first top dielectric layer and the second top dielectric layer comprises silicon oxide.

10. The method of fabricating a non-volatile memory cell of claim 1, wherein the step of removing the conductive layer and the second top dielectric layer outside of the first wench and the second trench is a chemical mechanical polishing process or an etch-back process.

11. The method of fabricating a non-volatile memory cell of claim 1, wherein the step of removing the mask layer comprises dry etching.

* * * * *